United States Patent [19]

Salter, III et al.

[11] Patent Number: 5,838,040
[45] Date of Patent: Nov. 17, 1998

[54] NONVOLATILE REPROGRAMMABLE INTERCONNECT CELL WITH FN TUNNELING IN SENSE

[75] Inventors: Robert M. Salter, III, Saratoga; Kyung Joon Han, Cupertino; Jack Zezhong Peng, San Jose; Victor Levchenko, San Francisco; Robert V. Broze, Santa Cruz, all of Calif.

[73] Assignee: GateField Corporation, Fremont, Calif.

[21] Appl. No.: 829,374

[22] Filed: Mar. 31, 1997

[51] Int. Cl.[6] ................................................. H01L 29/788
[52] U.S. Cl. ...................... 257/321; 257/326; 365/185.21
[58] Field of Search .................................. 257/314, 316, 257/321, 326; 365/185.05, 185.06, 185.1, 185.21, 185.28

[56] References Cited

U.S. PATENT DOCUMENTS

| 4,453,234 | 6/1984 | Uchida | 365/185 |
|---|---|---|---|
| 4,695,979 | 9/1987 | Tuvell et al. | 365/185 |
| 5,016,217 | 5/1991 | Brahmbhatt | 365/185 |
| 5,043,941 | 8/1991 | Sakamoto | 365/185 |
| 5,101,378 | 3/1992 | Radjy et al. | 365/185 |
| 5,247,478 | 9/1993 | Gupta et al. | 365/185 |
| 5,329,487 | 7/1994 | Gupta et al. | 365/185 |
| 5,428,571 | 6/1995 | Atsumi et al. | 365/185 |
| 5,488,586 | 1/1996 | Madurawe et al. | 365/185 |
| 5,594,363 | 1/1997 | Freeman et al. | 326/39 |
| 5,633,518 | 5/1997 | Broze | 257/314 |
| 5,640,344 | 6/1997 | Pani et al. | 365/185.05 |

*Primary Examiner*—David B. Hardy
*Attorney, Agent, or Firm*—Townsend and Townsend and Crew LLP; Henry K. Woodward

[57] ABSTRACT

Disclosed is a FPGA cell and array structure which use FN tunneling for program and erase. Each cell comprises a switch floating gate field effect transistor and a sense floating gate field effect transistor with the floating gates being common and the control gates being common. Programming of a cell is effected by voltage biasing the common control gate line and the source/drains of the sense transistor.

8 Claims, 8 Drawing Sheets

Topological Layout of new FPGA cell

Schematic of 4 row by 2 column array of new FPGA cells

Topological Layout of 4 row by 2 column array of new FPGA cells

Erase Waveform, Applied to all Rows

Programming Waveform for Selected Cell

Unselected Programming Waveform
(Selected Row, Unselected Column)

Unselected Programming Waveform
(Unselected Row, Selected Column)

NONVOLATILE REPROGRAMMABLE INTERCONNECT CELL WITH FN TUNNELING IN SENSE

BACKGROUND OF THE INVENTION

The present invention is related to field programmable integrated circuits, especially Field Programmable Gate Arrays (FPGAs), and more particularly, to floating gate MOS transistors used as switching elements in an FPGA.

Typically, an FPGA has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. Memory cells are reprogrammable and antifuses are programmable only once. A new non-volatile memory-type of programmable interconnect is disclosed in a patent application, U.S. application Ser. No. 08/754,116, entitled, "A GENERAL PURPOSE, NON-VOLATILE REPROGRAMMABLE SWITCH," filed Nov. 21, 1996 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. Basically an NVM cell has an MOS transistor with a floating gate which may be charged and/or discharged. Charging and/or discharging the floating gate provides for the non-volatile programmability feature of NVM technologies.

In an FPGA, indeed, in any integrated circuit, it is important that the elements of the FPGA be as compact as possible for an efficient layout of the circuit and be as easily manufactured as possible. Pending application Ser. No. 08/508,914 filed Jul. 28, 1995, now U.S. Pat. No. 5,633,518 issued May 27, 1997 by Robert U. Broze, for "Non-Volatile Reprogrammable Interconnect Cell With FN Tunneling and Programming" and assigned to the present assignee is directed toward highly compact cells of one of the programmable interconnects described in patent application Ser. No. 08/754,116, supra. An efficient array of such interconnects, each of which is selectively programmable, is achieved. Each programmable interconnect cell has a first MOS transistor having first and second source/drains connected to first and second circuit nodes respectively, and a floating gate for turning the first MOS transistor off and on responsive to the amount of charge on the gate. The cell also has a tunneling device with one terminal connected to the floating gate of the first MOS transistor and coupled to a programming/erase line through a tunneling oxide layer, a control gate capacitively coupled to the floating gate, and at least one tunneling control line for controllably inhibiting tunneling through the oxide layer. The tunneling control line and the programming/erase line form a PN junction which is close to, but laterally displaced from, the region below the tunneling oxide layer. Under a reverse bias, the 2 charge depletion region of the junction extends through the region below the tunneling oxide to block tunneling. This permits each programmable interconnect to be selectively programmable.

SUMMARY OF THE INVENTION

The present invention is directed to an improved FPGA cell and array structure with improved manufacturing yield, reliability, programming speed, threshold margining, and cost. The cell includes a gate switch transistor and a gate sense transistor having common floating gates, the sense transistor also providing the programming and erasing of the switch transistor by Fowler-Nordheim electron tunneling to and from the transistor drain and the floating gate. In an array of cells or an FPGA tile, two column lines are respectively connected to the source and drain regions of the sense transistors in each column for use in sensing the threshold voltage of the sense transistor and switch transistor and thus measuring the programmed or erased state of the switch transistor.

In accordance with a feature of the invention, program disturb of cells is reduced by overlapping the row-select/unselect voltage window with the column-select/unselect voltage window by a voltage $V_{UUD}$. This voltage will increase stress of programmed bits whose rows and columns are both unselected but will reduce stress on erased bits where only the row or column, but not both, are unselected. As used herein, "stress" means an electric field which has the potential, over time, of causing disturb. As used herein "disturb" is an undesired change in the threshold voltage of an FPGA cell due to removal (or addition) of electronic charge from the floating gate as a result of a set of externally applied bias conditions for a specified period of time.

The invention and objects and features thereof will be more readily apparent from the following detailed description and appended claims when taken with the drawings.

DETAILED DESCRIPTION OF PREFERRED EMBODIMENT

Figure 1:
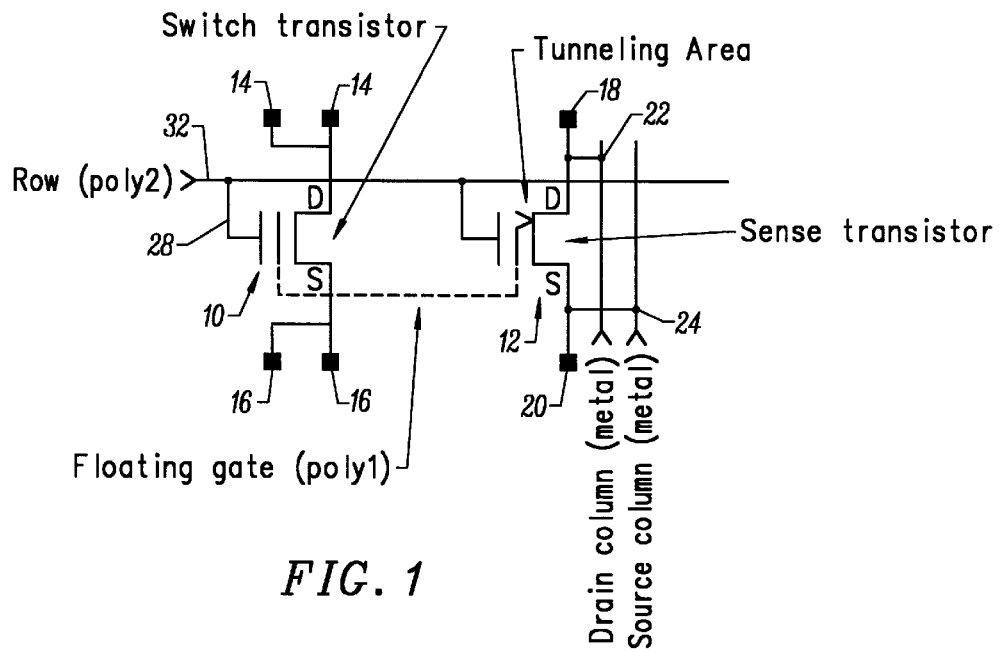
FIG. 1 is a schematic of an FPGA cell in accordance with the invention.

FIG. 1 is a schematic of an FPGA cell in accordance with the invention which includes a switch transistor 10 and a Fowler-Nordheim tunneling device and sense transistor 12. The switch transistor has contacts 14 and 16 connected respectively to the drain and source regions of the transistor, and sense transistor 12 has contacts 18 and 20 connected respectively to the drain and source regions of the transistor. The drain of the sense transistor is connected also to a drain column (metal) line 22, and the source is connected to a source column (metal) line 24. Column lines 22,24 are connected to all source and drain regions of sense transistors in one column. Switch transistor 10 and sense amplifier 12 share a common floating gate 26 with the floating gate being positioned between control gate 28 of the switch transistor 10 and the control gate 30 of the sense transistor 12. The control gates are connected to a row (poly 2) line 32.

Figure 2:
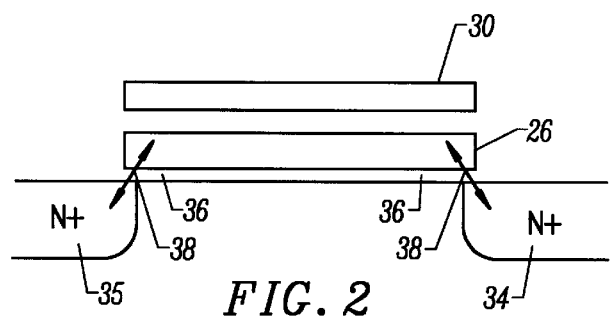
FIG. 2 is a section view of the sense transistor of FIG. 1.

As illustrated more clearly in the section view of the sense transistor in FIG. 2, floating gate 26 in the sense transistor is positioned in close abutment or overlap of the N+ doped drain 34 and/or source 35 of the sense transistor with special tunneling oxide 36 having a thickness on the order of 80 Å–120 Å separating floating gate 26 and N+ drain 34 to facilitate the tunneling of electrons between the floating gate and drain regions as indicated by the arrow 38. Thus erase of the FPGA cell occurs by electron tunneling to the floating gate from the drain source and channel regions. Programming of the FPGA cell occurs by electron tunneling from the floating gate to the drain and/or the source.

Figure 3:
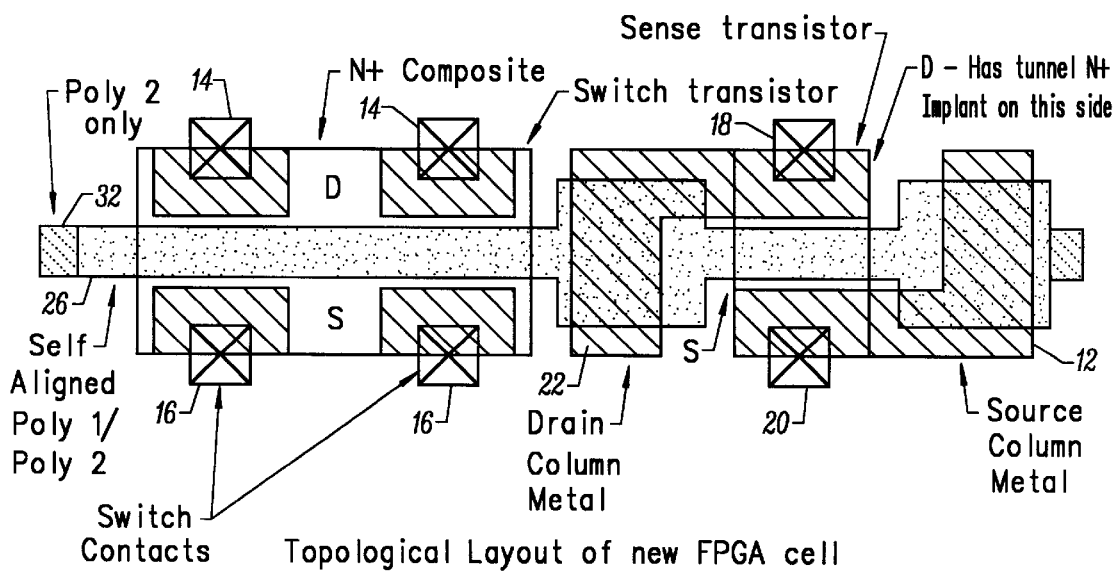
FIG. 3 is a plan view illustrating the layout of the FPGA cell of FIG. 1.

FIG. 3 is a plan view of the layout of the FPGA cell of FIG. 1. Switch transistor 10 and sense transistor 12 are in spaced horizontal alignment in a semiconductor wafer with floating gate 26 comprising a first polysilicon line (poly 1) overlying the channel region between the source and drain of transistor 10 and the source and drain of sense transistor 12. The poly 1 line terminates on either side of the cell and does not continue to adjacent cells. The control gates 28,30 of the two transistors is provided by a second polysilicon line (poly 2) 32 which extends over the poly 1 line and is self-aligned therewith. The poly 2 line continues to all transistors in cells arranged in a row. The drain column line 22 is connected to contact 18 to the drain and continues vertically to contact the drain terminals of all sense transistors in a column. Similarly, the source column metal line 24 engages source contact 20 and extends vertically to contact all source regions of sense transistors in the column. Thus, in a column of FPGA cells, all sense transistor sources are connected to one column line, referred to as a source column, and all drains are connected to a second column line referred to as a drain column. The cell illustrated in FIG. 3 contains half of a shared source contact and half of a shared drain contact for adjacent sense devices, which also perform program and erase functions. As noted above, the sense device is required to test the programmed or erased state of each FPGA cell since the switch transistors are wired into the FPGA array and are not accessible.

Figure 4A:
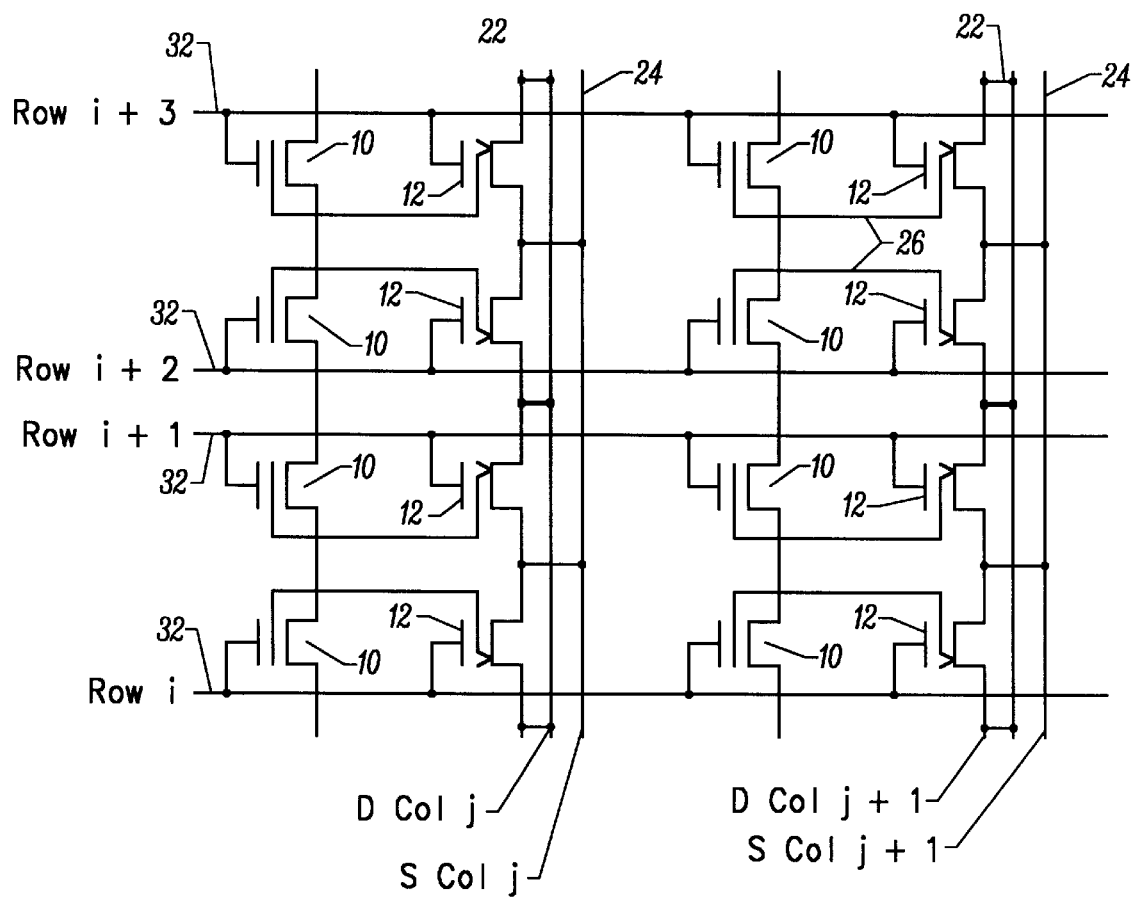
FIG. 4A is a schematic of a portion of an FPGA tile including two columns and four rows.
Figure 4B:
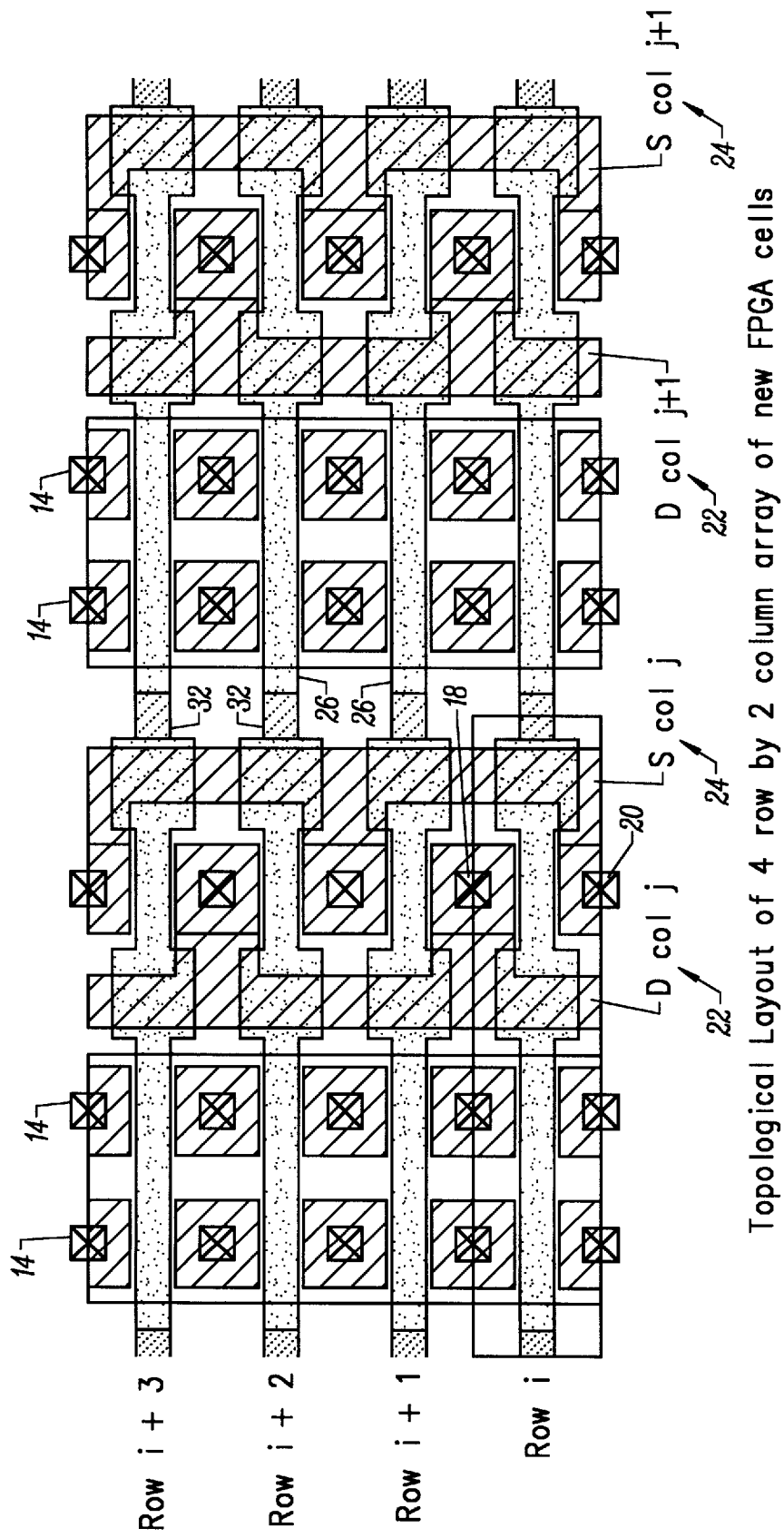
FIG. 4B is a plan view of the FPGA cells of FIG. 4A.

An FPGA tile comprises an array of FPGA cells, for example, 32 rows by 5 columns for a core tile. FIGS. 4A and 4B are a schematic and a plan view of two columns and four rows in such an array. Reference numerals of FIGS. 1–3 are used in FIGS. 4A,4B with all poly 1 floating gates label 26, poly 2 row lines label 32, drain column lines label 22, and source metal column lines label 24. The four rows are labelled row $_i$–row$_{i+3}$, the drain columns are labelled DCOL$_j$–DCOL$_{j+1}$, and the source columns are labelled SCOL$_j$ and SCOL$_{j+1}$. The measurement of programmed and erased sense transistor thresholds for each bit in the array of sense transistors is performed in the same manner that a NOR ROM is accessed. By biasing "off" each unselected bit sense transistor of the column and margining the selected bit. This measurement "margining" is done by varying the selected cells control gate (row) voltage while detecting whether drain current is above or below some reference level. The row biases are driven by row drivers which have several modes of operation. They must supply high positive voltages with respect to the array during "erase", they must supply a positive and negative voltages to the row during "program" and "read", and they must supply a constant positive bias during "operating" mode. The column biases are applied by column drivers. To program, the columns must be driven as a pair to a positive voltage. One of the pair is forced to a low positive voltage level while sensing current during "read" while the other is held at ground. At all other times they are both grounded or open circuited.

Table 1 gives approximate row and column and peak voltage levels for all operating modes. Program disturb is reduced to tolerable levels by overlapping row select/unselect window voltages with the column select/unselect window voltages by $V_{UUD}$. This voltage will stress programmed bits whose rows and columns are both unselected, but reduce programming stress on erase bits where only the row or column, but not both, are unselected. These formulas are ideal examples, voltage levels may be adjusted to account for peripheral circuit breakdown voltages and row versus column programming time considerations.

TABLE 1

|  | Erase | Program | Read/Margin | Operate |
|---|---|---|---|---|
| Selected Row | Ramp to $V_{ERASE}$ | Ramp to | $-V_R$ to $+V_R$ | OV to VCC |
| Selected Column Pair | Both = OV | Both Ramp to $+ V_p/(2*(1 - R_c)$ | Drain column ≈ 1 v Source column = Ov | Both = OV |
| Unselected Row | — | $V_{UUP}$ | $-(V_R + \Delta)$ | — |
| Unselected Columns | — | OV | OV | — |

Figure 5:
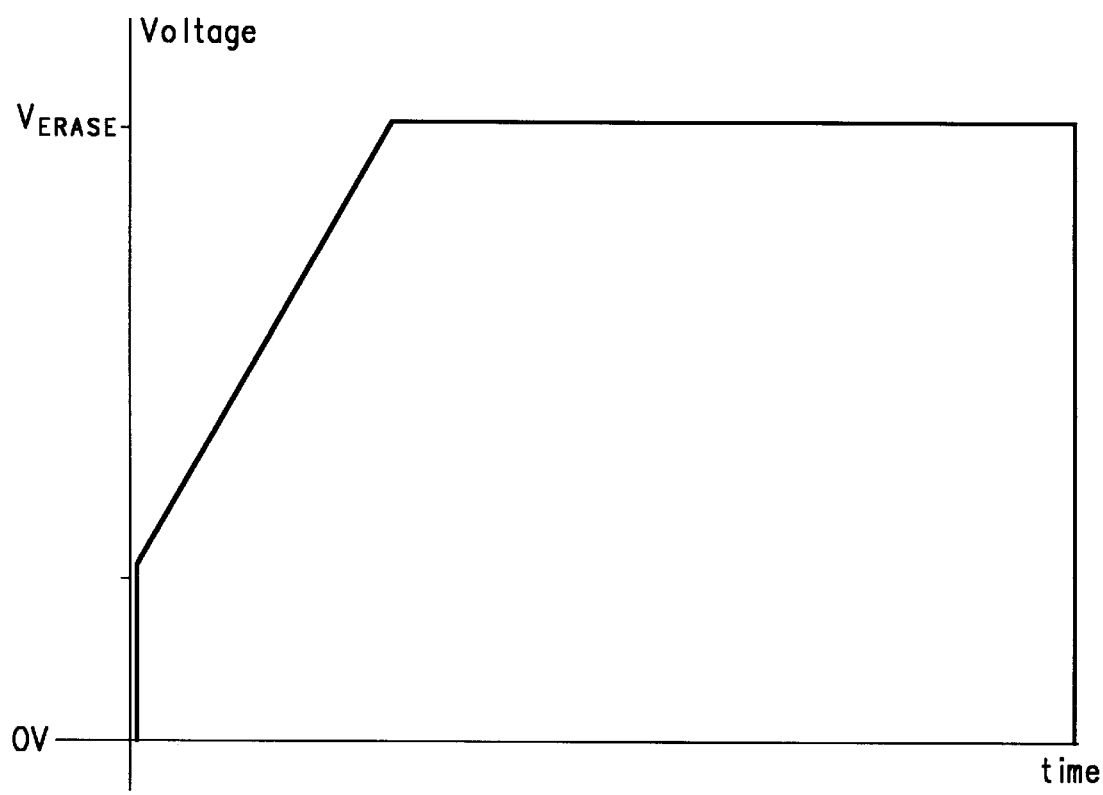
FIG. 5 is an erase voltage waveform as applied to rows in an FPGA cell array, in accordance with the invention.

FIG. 5 shows the waveform for voltages applied to rows during "erase". All other nodes are at ground. Since this is a bulk operation, no disturb will occur. During erase, electrons tunnel from the sense transistor drain/source and channel which has its surface in inversion, to the floating polysilicon gate. This leaves a negative charge on the floating gate of the switch and the sense transistor, causing them to be "off" unless a complementary voltage is coupled onto the floating gate from the row (control gate).

The writing or "programming" operation is used to place selected, erased switch and sense transistors back in the "on" state. This is accomplished by forcing a negative voltage on the row and a positive voltage on the column pair. The floating gate will be driven negative with respect to the sense transistor drain and source, and electrons will tunnel from the floating gate to the drain junction, which as illustrated in FIG. 2 is engineered to extend under the floating gate and polysilicon gate stack on one or both sides. This operation leaves a net positive charge on the floating gate which moves the switch and sense transistors to the "on" state.

Figure 6A:
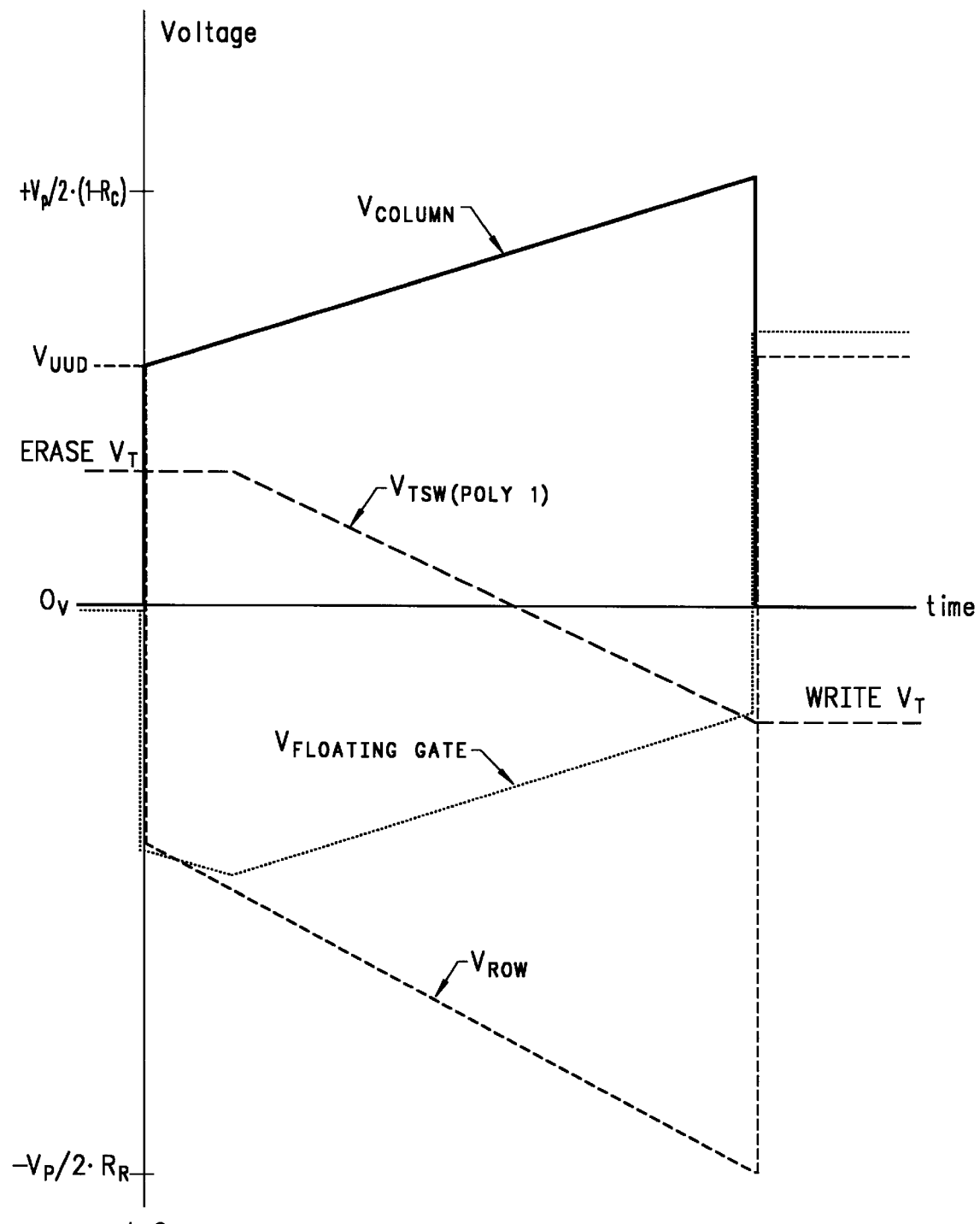
FIG. 6A illustrates programming voltage waveforms for a selected cell.

FIG. 6A illustrates waveforms for the selected row and column during "program" operation. The row (control gate) is ramped negatively while the column lines are ramped positively to remove electrons from the floating gate which leaves a net positive charge on the floating gate after programming.

Figure 6B:
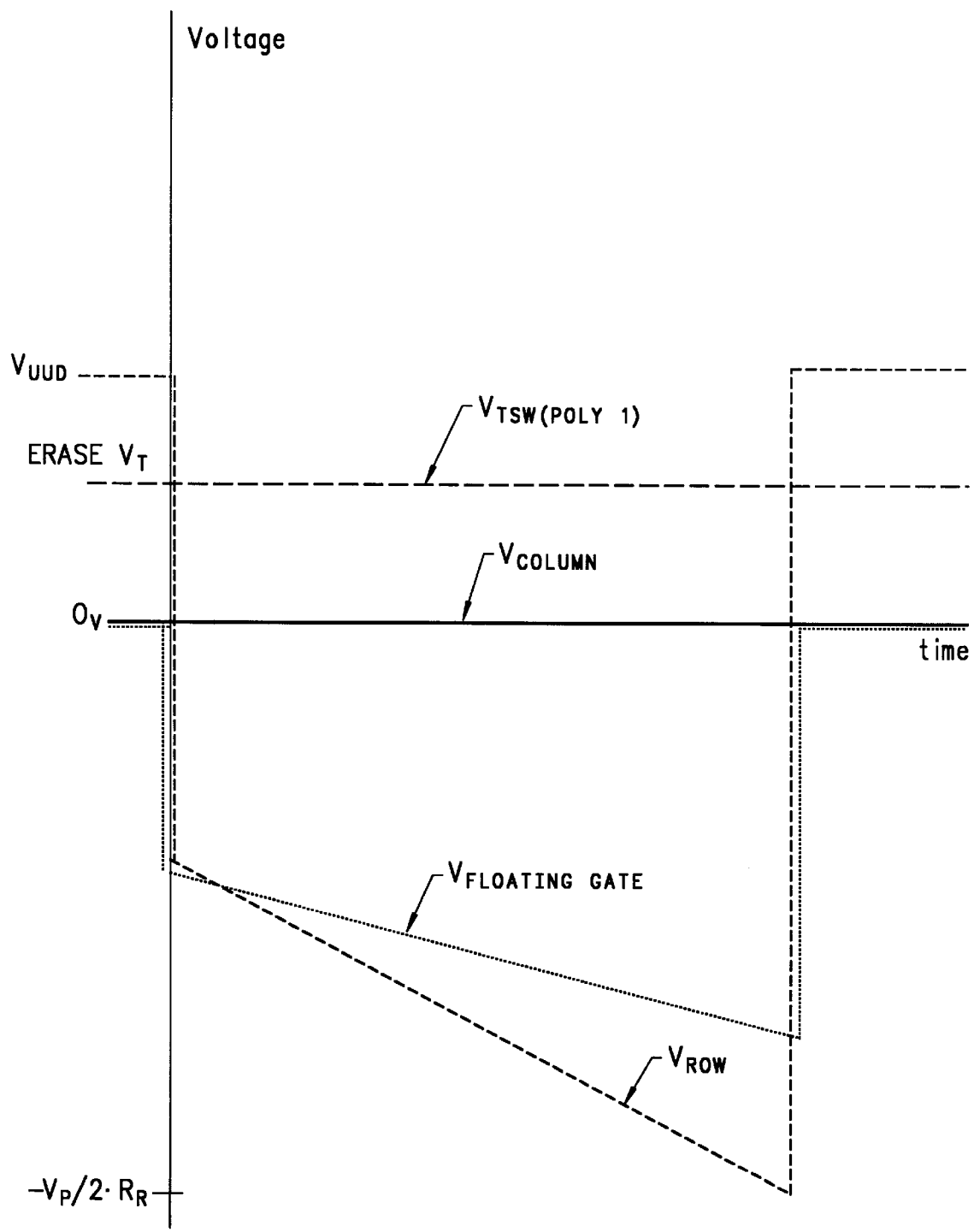
FIG. 6B illustrates voltage waveforms for an unselected programming waveform (selected row, unselected column)

FIG. 6B illustrates the waveforms as applied for a selected row and unselected column during a "program" operation.

Figure 6C:
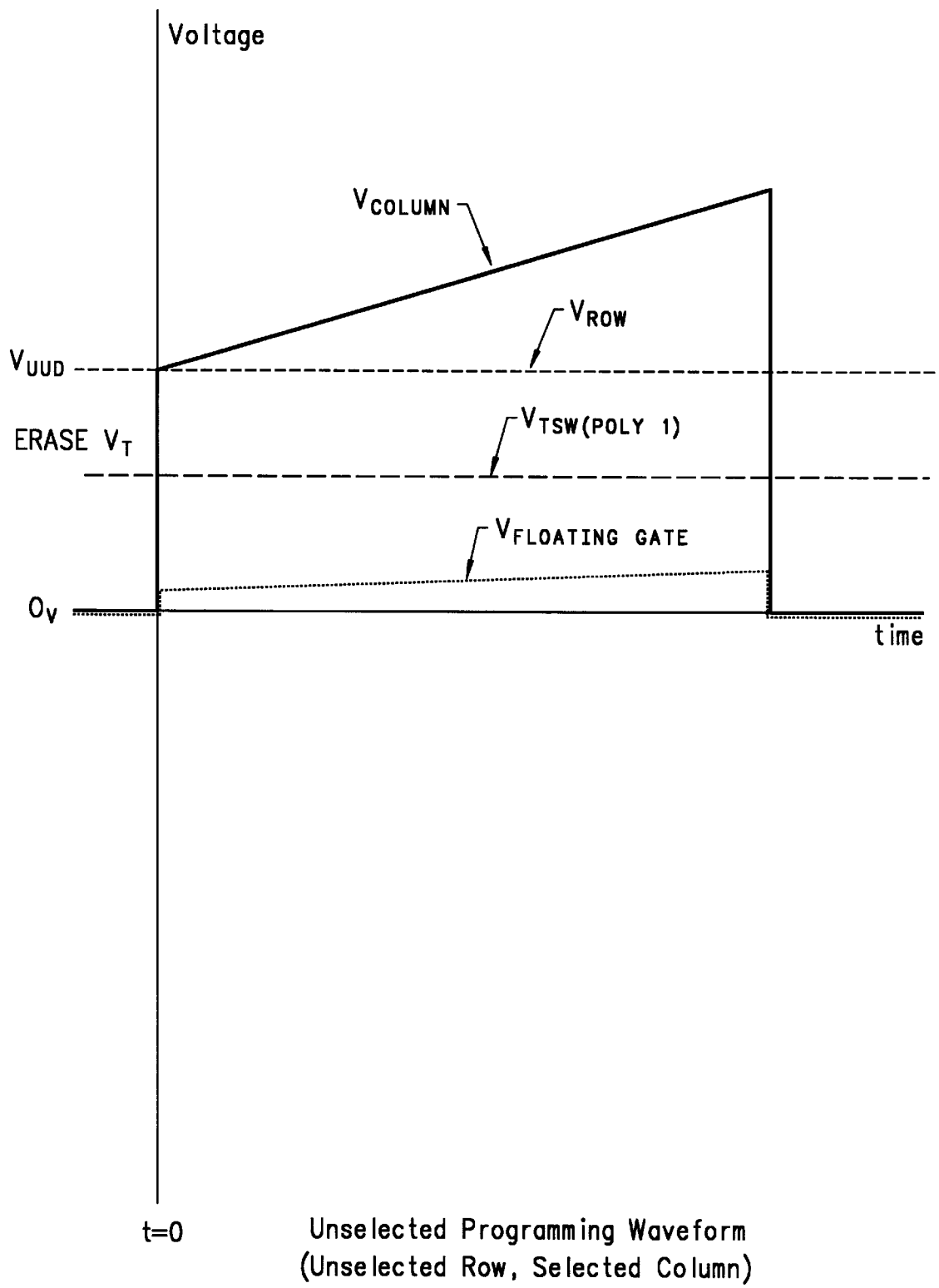
FIG. 6C illustrates an unselected program waveform (unselected row, selected column)

FIG. 6C illustrates the voltage waveform for an unselected row and selected column during "program" operation.

Figure 6D:
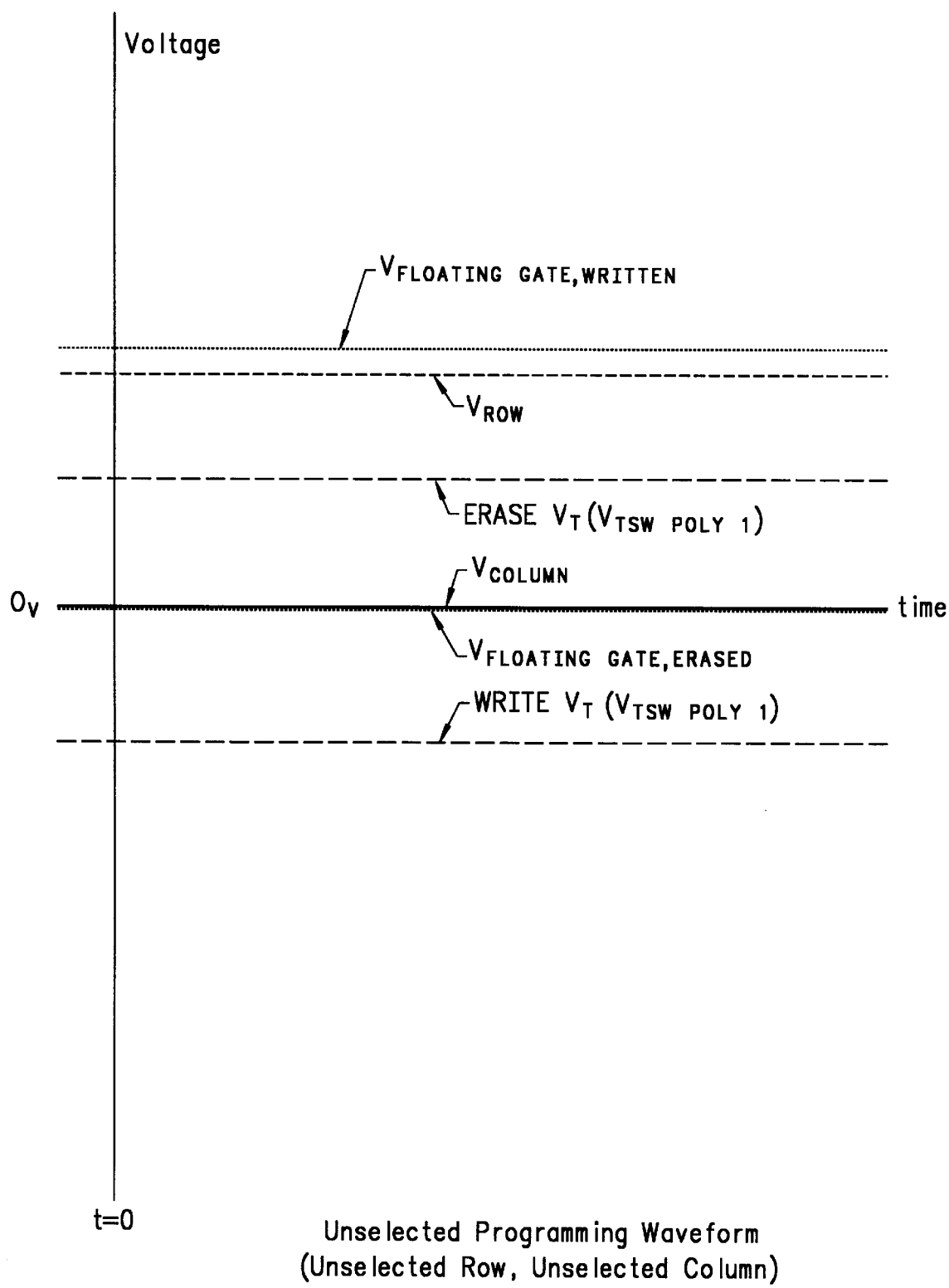
FIG. 6D illustrates an unselected programming waveform (unselected row, unselected column).

FIG. 6D illustrates voltage waveforms for both row and column unselected during a "program" operation.

During a read margining operation, the sense transistor in the selected tile (FIG. 4A) is turned "on" and all unselected rows in the rest of the array are brought to a negative voltage to turn them "off". The selected row voltage is ramped high for an "erased" bit. When the column reaches a threshold current with the bias set to a low voltage, the row voltage is recorded as the "erase margin" for that bit. Similarly, the row voltage is ramped negative for a programmed bit and the voltage on the threshold current is the "program margin".

In the FPGA operating mode, positive DC bias is applied to all rows. This shifts the voltage window of operation of the switches from slightly "off" for the erased cells to strongly "on" for the programmed cells and allows full swing signals to pass through the "on" switches while not disturbing any current through the "off" switches.

Write disturb is minimized by overlapping select/unselect windows of voltages applied to rows and columns during programming. This reduces the disturb area on the unselected cells that have either their row or column selected, but increases the disturb bias on cells that have neither their rows nor columns selected. The row and column voltage window are overlapped to minimize programming disturb in all cases.

By applying opposite polarity time linear voltage ramps to the selected row and column, charge removal from unselected cells on selected rows or columns relative to the effects on other waveforms is minimized.

Column programming can be used instead of conventional row programming to reduce the overall disturb. The advantage of this approach is that due to row and column coupling ratio differences, the disturb of unselected rows may be higher than that of unselected columns. A disadvantage of this approach, however, is that column programming is more costly to implement in terms of circuit area, testing complexity and test time.

The described FPGA cell and array are readily fabricated using conventional EEPROM-CMOS processing with few masks. By using the tunnel oxide for programming and erasing, the use of non-self-aligned EPROM cell structures and associated masking processing steps are avoided. The two device cell structure is smaller in area, and full margining of every bit is achieved for both erased and programmed states.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A programmable interconnect for selectively connecting circuit nodes in an integrated circuit comprising
    a first field effect transistor having first and second source/drains connected to a first and a second circuit node, a floating gate for storing charge, and a control gate for turning said first field effect transistor on and off responsive to charge on the floating gate,
    a second field effect transistor having first and second source/drains, a floating gate separated from at least one source/drain by tunneling dioxide, and a control gate capacitively coupled to the floating gate, the floating gate of the first and second field effect transistors being interconnected, and
    a first conductive line and a second conductive line connected to the first and second source/drains of the second field effect transistor, whereby programming of the interconnect is effected by applying voltages to the first and second conductive lines and to the control gate of the second field effect transistor, and the sensing of conducting and non-conducting states of a node is by selectively monitoring conduction of the second field effect transistor through the first conductive line and the second conductive line.

2. The programmable interconnect as defined by claim 1 wherein said floating gates comprise a first polysilicon line running between and spaced from the source/drains of the first field effect transistor and running between and spaced from the source/drains of the second field effect transistor.

3. The programmable interconnect as defined by claim 2 wherein said control gates comprise a second polysilicon line extending to adjacent programmable interconnects in an array of programmable interconnects.

4. The programmable interconnect as defined by claim 3 wherein the first and second conductive lines comprise metal lines running perpendicular to the first polysilicon line and the second polysilicon line.

5. The programmable interconnect as defined claim 4 wherein the first polysilicon line is restricted to the first field effect transistor and the second field effect transistor.

6. A programmable interconnect as defined by claim 5 wherein the first polysilicon line and the second polysilicon line are self-aligned.

7. The programmable interconnect as defined by claim 6 wherein the first field effect transistor is formed in a first region of a semiconductor body, the second field effect transistor is formed in a second region of the semiconductor body adjacent to the first region.

8. An array of programmable interconnects for selectively connecting circuit nodes in an integrated circuit comprising
    a plurality of interconnect cells arranged in rows and columns and each programmable to connect and disconnect circuit nodes,
    each cell having a first field effect transistor aligned with first field effect transistors of cells in a first column, and a second field effect transistor aligned with second field effect transistors of cells in a second column, the first and second field effect transistors of a cell being aligned with first and second field effect transistors of cells in the same row,
    each cell having a first polysilicon line running between and spaced from source/drains of the first field effect transistor and between and spaced from source/drains of the second field effect transistor and functioning as a common floating gate for the first and second field effect transistors, a second polysilicon line overlying the first polysilicon line and functioning as a common control gate for the first and second field effect transistors, the second polysilicon line extending to other cells in a row, and first and second metal lines contacting source/drains of the second field effect transistor and extending to other cells in a column, whereby programming of a cell is effected by applying voltages to the first and second metal lines and to the second polysilicon line, and the sensing of conducting and nonconducting states of a node is by selectively monitoring conductance of the second field transistor of the cell through the first and second metal lines.

\* \* \* \* \*